United States Patent [19]

Hietala et al.

[11] Patent Number: 5,448,770
[45] Date of Patent: Sep. 5, 1995

[54] TEMPERATURE-COEFFICIENT CONTROLLED RADIO FREQUENCY SIGNAL DETECTING CIRCUITRY

[75] Inventors: Alexander W. Hietala, Cary, Ill.; Troy L. Stockstad, Phoenix; Robert L. Vyne, Tempe, both of Ariz.

[73] Assignee: Motorola, Inc., Schaumburg, Ill.

[21] Appl. No.: 42,956

[22] Filed: Apr. 5, 1993

[51] Int. Cl.[6] .................... H04B 1/04; H03D 1/18; H03G 3/12; H03F 3/10
[52] U.S. Cl. .................. 455/126; 455/127; 329/318; 330/129; 330/279; 330/288; 330/289
[58] Field of Search ............. 455/126, 127, 115–117; 330/278, 279, 129–131, 288, 289; 307/491; 329/318, 340, 351; 327/362, 306, 309, 312, 314

[56] References Cited

U.S. PATENT DOCUMENTS

| | | | |
|---|---|---|---|
| 4,000,472 | 12/1976 | Eastland | 329/351 |
| 4,051,441 | 9/1977 | Wheatley, Jr. | 330/278 |
| 4,101,841 | 7/1978 | Okada et al. | 330/279 |
| 4,492,926 | 1/1985 | Kusakabe et al. | 327/306 |
| 4,523,155 | 6/1985 | Walczak | 330/279 |
| 4,636,742 | 1/1987 | Oritan | 330/289 |
| 4,996,500 | 2/1991 | Larson et al. | 455/116 |
| 5,150,075 | 9/1992 | Hietala | 330/279 |
| 5,200,654 | 4/1993 | Archer | 307/491 |
| 5,278,994 | 1/1994 | Black et al. | 330/278 |

FOREIGN PATENT DOCUMENTS

| | | | |
|---|---|---|---|
| 8218234 | 12/1983 | Japan | 455/115 |
| 2084826 | 4/1982 | United Kingdom . | |
| 2095937 | 10/1982 | United Kingdom . | |
| 2135556 | 8/1984 | United Kingdom | 455/115 |

Primary Examiner—Chi H. Pham
Assistant Examiner—Mark D. Wisler
Attorney, Agent, or Firm—Randall S. Vaas

[57] ABSTRACT

A TC controlled RF signal detecting circuitry (211) used in the output power control circuit of a TDMA RF signal power amplifier includes positive coefficient current source (303) producing current I+ having a positive TC, negative coefficient current source (305) producing current I− having a negative TC, and current mirror (301) for summing currents I+ and I− to produce substantially identical compensated mirror currents Im1 and Im2. Anti-clamping current mirror (309) mirrors current Im2 to produce compensated currents Ia1 and Ia2, which are applied to and bias a Schottky diode coupled in series to a resistor network in each leg of diode detector (311). Each leg of diode detector (311) has a positive TC, which is substantially offset by the negative TC of compensated currents Ia1 and Ia2. Schottky diode (431) in one leg of diode detector (311) half-wave rectifies RF feedback signal (212) to produce temperature and voltage compensated power level signal (229), which has a DC level proportional to the output power level of RF output signal (214). By using TC controlled RF signal detecting circuitry (211), power level signal (229) has a DC level which is stable to within 5 mV over temperature ranging from −55° C. to +125° C. and over power supply voltage ranging from 2.7 V to 4.75 V.

35 Claims, 2 Drawing Sheets

TEMPERATURE-COEFFICIENT CONTROLLED RADIO FREQUENCY SIGNAL DETECTING CIRCUITRY

FIELD OF THE INVENTION

Generally, this invention relates to radio frequency (RF) signal power amplifier control circuits, and more specifically, to an improved temperature-coefficient (TC) controlled RF signal detecting circuitry for use in output power control circuits for RF signal power amplifiers.

BACKGROUND OF THE INVENTION

The use of power amplifiers in transmitting RF signals has many applications, including but not limited to radiotelephone communications systems. In a cellular radiotelephone communications system, there are multiple fixed site transceivers located throughout a geographic area for providing radio communications in its surrounding coverage area, referred to as a cell. Each fixed site transceiver is an interface between the line telephone system and portable and mobile radiotelephones located in its cell. The fixed site transceivers and radiotelephones communicate by sending and receiving RF signals to each other.

In frequency division multiple access (FDMA) radiotelephone systems, each requesting radiotelephone is allocated a radio channel (an RF transmit frequency and an RF receive frequency) for the duration of the ensuing communications with the fixed site transceiver. During a phone call, the radiotelephone transmitter would turn-on and remain on the RF transmit frequency for the entire duration of the phone call. Thus, the radiotelephone transmitter and subsequently the RF power amplifier of the radiotelephone only need be turned on once and turned off once for each phone call. Likewise, the transmitter of the fixed site transceiver also remains on for the duration of a phone call. Since the transmitters in FDMA radiotelephone systems are only turned on at the beginning of a call and turned off at the end of a call, the speed at which the power amplifier turns on or off may be relatively slow.

In time division multiple access (TDMA) radiotelephone systems such as the Global System for Mobile Communications (GSM) radiotelephone system currently in use in Europe, 8 radiotelephones can share a single TDMA channel since there are 8 available time slots that are repeated in successive frames. Each radiotelephone is allocated one time slot of a TDMA channel. During the assigned time slot, the radiotelephone ramps up its power amplifier to the proper frequency and output power level, transmits the desired information, and then ramps down its power amplifier so as not to disturb or interfere with the other users sharing the same TDMA channel. Due to the short length of each time slot (e.g. 577 microseconds), it is necessary to accurately control and shape the ramp up and ramp down of the power amplifier output over a wide temperature range. In GSM radiotelephone systems, a time mask and a spectral frequency mask for the ramp up and ramp down of the power amplifier output has been stringently specified by GSM Recommendations 05.05 (Subsections 4.2.2 and 4.5.2, and Annex 2). If the GSM recommendations are not strictly followed, telephones calls on adjacent TDMA channels may be subjected to interference in both time and frequency.

A power amplifier system capable of meeting the GSM recommendations is disclosed in U.S. Pat. No. 5,150,075. However, this power amplifier system relies heavily on a stable RF signal detecting circuitry that is not susceptible to variations in temperature and the power supply voltage. Accordingly, there is a need for an improved RF signal detecting circuitry that is highly stable over a wide range of variations in both temperature and power supply voltage.

SUMMARY OF THE INVENTION

The present invention encompasses detecting circuitry coupled to an RF signal from a signal source, including a first current source for generating a first current a first current mirror device coupled to the first current for producing a first mirror current; and a rectifying circuit being biased by the first mirror current and rectifying the RF signal to produce an output signal. According to a feature of the present invention, the first current source may generate a first current having a positive temperature coefficient of change with temperature; a second current source may generate a second current having a negative temperature coefficient of change with temperature; and a second current mirror device may combine the first and second currents to produce a second mirror current, which is coupled to the first current mirror device.

DESCRIPTION OF THE PREFERRED EMBODIMENT

Figure 1:
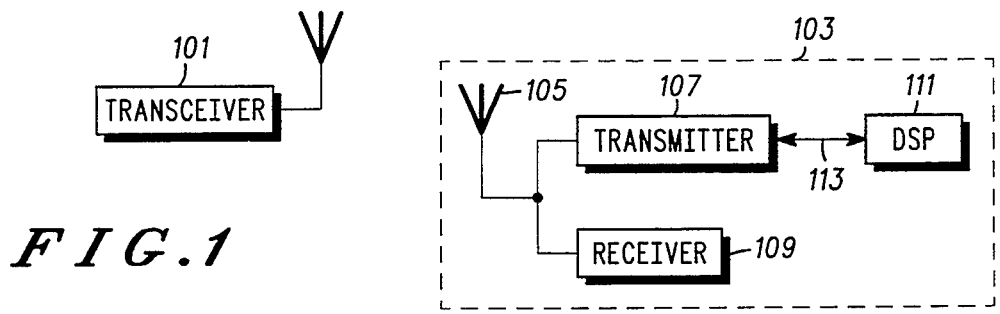
FIG. 1 is a block diagram of a radiotelephone communications system, including one or more fixed site transceivers and one or more radiotelephones which may advantageously utilize a TC controlled RF signal detecting circuitry embodying the present invention.

Referring to FIG. 1, there is illustrated a block diagram of a cellular radiotelephone system, covering a geographic area, such as the metropolitan area of a city or an entire country, and including fixed site transceivers 101 located in respective cells and portable and mobile radiotelephones 103 which may advantageously utilize a TC controlled RF signal detecting circuitry embodying the present invention. Each fixed site transceiver 101 communicates RF signals to radiotelephones 103 when they are located in its cell.

In the preferred embodiment, the cellular radiotelephone system in FIG. 1 is a GSM TDMA digital cellular radiotelephone system implemented and operating in accordance with the GSM Recommendations promulgated by European Telecommunications Standards Institute (ETSI) and adopted for use in many countries of Europe. The GSM radiotelephone system in FIG. 1 is assigned two RF signal frequency bands for duplex communications, one band at 890–915 MHz and the other band at 935–960 MHz. In each of these bands, the RF signal frequencies are spaced from one another by 200 kHz. Each RF signal is a TDMA RF signal having 8 time slots repeated in successive frames for communications. Each RF signal frequency of one band together with a corresponding RF signal frequency from the other band is called a TDMA channel. Each TDMA channel is capable of handling 8 simultaneous duplex communications between each transceiver 101 and 8 different radiotelephones 103 within its cell. Each radiotelephone 103 is assigned a time slot in which to broadcast and a time slot in which to receive information from the transceiver 101. Each time slot is approximately 577 microseconds in duration.

Radiotelephone 103 includes a transmitter 107, a receiver 109, and a digital signal processor (DSP) controller 111. Several signals are transmitted between DSP 111 and transmitter 107 on multiple signal lines 113. DSP controller 111 may be implemented with any conventional DSP, such as, for example, the DSP 56000 available from Motorola, Inc. Radiotelephone 103 may be any conventional GSM radiotelephone having a transmitter, receiver and DSP controller, such as, for example, GSM radiotelephone model number F19UVD0960AA available from Motorola, Inc., Cellular Subscriber Group, 600 North US Highway 45, Libertyville, Ill. 60048 USA.

In a GSM radiotelephone systems, transmitter 107 and transceiver 101 both contain power amplifiers which comply with stringent requirements as defined by GSM Recommendations 05.05 (Subsections 4.2.2 and 4.5.2, and Annex 2). These specifications require any transmitter to meet a specific time mask and a specific spectral frequency mask as shown in U.S. Pat. No. 5,150,075.

Antenna 105 is used for communication of RF signals between radiotelephone 103 and transceiver 101. Upon receiving RF signals, antenna 105 converts the signals into electrical RF signals which are coupled to the receiver 109. Receiver 109 demodulates and converts received RF signals into information signals, including voice and data signals, usable by the rest of radiotelephone 103.

During transmission of RF signals by radiotelephone 103, DSP 111 couples information to transmitter 107 and controls transmitter 107 via signal lines 113. Transmitter 107 converts the information into electrical RF signals and amplifies them by the appropriate amount. The amplified electrical RF signals are coupled to antenna 105 which converts them into RF signals that are radiated to transceiver 101.

Figure 2:
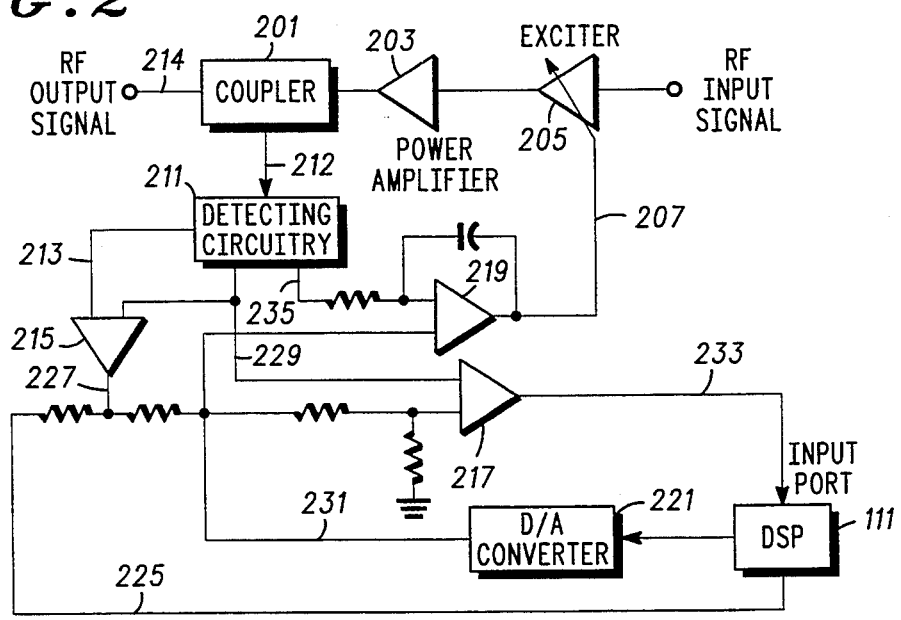
FIG. 2 is a block diagram of a power amplifier and power amplifier control circuit, which may advantageously utilize a TC controlled RF signal detecting circuitry embodying the present invention.

Referring to FIG. 2, there is illustrated a block diagram of power amplifier 203 and its associated controllers, which are located in the transmitter 107. RF input signal 209 contains information including voice and data signals. Exciter amplifier 205 is an adjustable power amplifier which amplifies RF input signal 209 in response to amplification control signal 207 to produce an output which is coupled to power amplifier 203 and amplified by a fixed gain to produce RF signal output 214 at a desired output power level. Coupler 201 is a conventional electromagnetic coupler which couples power amplifier 203 to antenna 105 without causing excessive loss and which also provides an RF feedback signal 212 which has an amplitude proportional to the output power level of RF signal output 214.

Detecting circuitry 211 is coupled to RF feedback signal 212 for producing a power level signal 229, which has a magnitude proportional to the output power level of RF output signal 214. Detecting circuitry 211 also produces a reference signal 213 having a magnitude which is substantially equal to the DC offset voltage of power level signal 229 when power amplifier 203 is turned off and not transmitting.

Comparator 215 is coupled to power level signal 229 and reference signal 213 for producing an output signal 227, which has a low voltage when the magnitude of power level signal 229 exceeds the magnitude of reference signal 213. Output signal 225 is generated by the DSP 111 and used to pull up output signal 227. Output signal 225 is high at the beginning of an active time slot during which radiotelephone 103 or transceiver 101 is transmitting, and is lowered after the desired output waveform of RF output signal 214 has been produced. This causes output signal 227 to be high during an active time slot prior to power amplifier 203 and exciter amplifier 205 becoming active. Upon activation of the power amplifier 203 and the exciter amplifier 205, output signal 227 becomes low.

After a predetermined time interval (10 microseconds in the preferred embodiment) from the beginning of an active time slot, DSP 111 generates a desired waveform and applies it to digital-to-analog converter 221. D/A converter 221 converts the digital input from DSP 111 into an analog output signal 231, referred to as an AOC signal. AOC signal 231 and VGAIN signal 235 are coupled to integrator 219, and compared and integrated by integrator to produce amplification control signal 207, which in turn is coupled to exciter amplifier 205 for varying its amplification level. AOC signal 231 has a value for producing one of a plurality of output power levels of the RF output signal 214 from power amplifier 203. In the preferred embodiment, the preferred waveform is a raised cosine which ramps RF output signal 214 of power amplifier 203 smoothly up to its desired output power level. The AOC signal 231 and the raised cosine response of the RF output signal 214 are illustrated and described in more detail in U.S. Pat. No. 5,150,075.

A saturation control loop, consisting of coupler 201, detecting circuitry 211, comparator 217 and DSP 111, prevents the exciter amplifier 205 and power amplifier 203 from exceeding their rated output power limits. Comparator 217 is a saturation detector which compares power level signal 229 to AOC signal 231 to determine if power level signal 229 responds to changes in AOC signal 231. When saturation is reached, the voltage of power level signal 229 will not change in response to a change in the voltage of AOC signal 231. Therefore, when the voltage of power level signal 229 drops below the voltage of AOC signal 231, output signal 233 of comparator 217 is low indicating saturation of exciter amplifier 205 and power amplifier 203. The saturation comparator output signal 233 is coupled to DSP 111 which contains a saturation detection algorithm.

According to the saturation detection algorithm, DSP 111 reduces the voltage of AOC signal 231 in successive steps until the voltage of AOC signal 231 drops below voltage of power level signal 229. The operation of the saturation control loop is described in further detail in U.S. Pat. No. 5,278,994, entitled "Power Amplifier Saturation Detection and Correction Method and Apparatus", issued to Gregory R. Black et al. on Jan. 11, 1994, and assigned to the Motorola, Inc.

Figure 3:
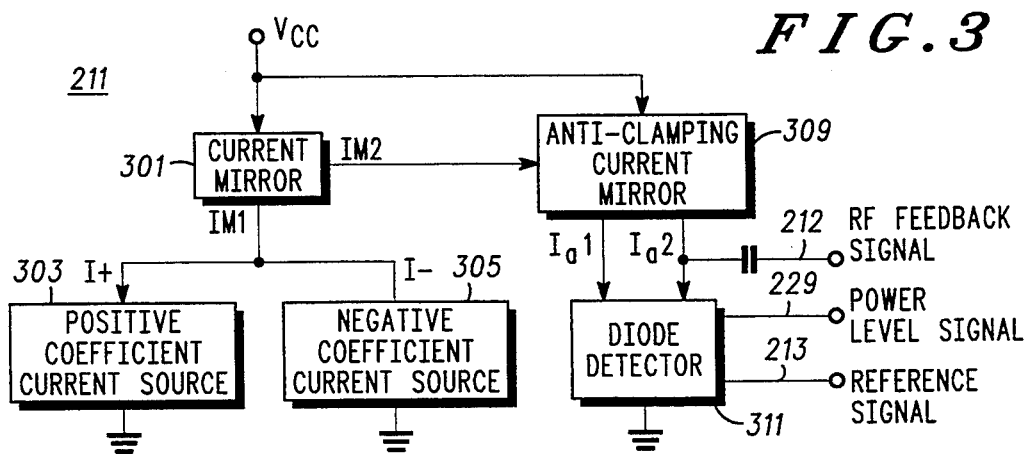
FIG. 3 is a block diagram of a TC controlled RF signal detecting circuitry embodying the present invention.

Referring to FIG. 3, there is illustrated a block diagram of TC controlled RF signal detecting circuitry 211 embodying the present invention. Positive coefficient current source 303, negative coefficient current source 305, and current mirror 301 in detecting circuitry 211 produce substantially identical currents Im1 and its mirror Im2. Positive coefficient current source 303 produces current I+ having a positive coefficient of change with temperature. In the preferred embodiment, current I+ has a temperature coefficient of +333 ppm/° C. Negative coefficient current source 305 produces current I− having a negative coefficient of change with temperature. In the preferred embodiment, current I− has a temperature coefficient of −6000 ppm/° C. Currents I+ and I− and their respective temperature coefficients are scaled and summed in predetermined proportion in current mirror 301 to produce compensated current Im1. In the preferred embodiment, current Im1 has a temperature coefficient of −3000 ppm/° C. Current mirror 301 produces current Im2 as the substantially identical mirror of compensated current Im1.

Compensated current Im2 is coupled to anti-clamping current mirror 309 which applies mirrored currents Ia1 and Ia2 of current Im2 to diode detector 311. Diode detector 311 includes two legs, each including a Schottky diode coupled in series to a resistor network to signal ground, and each coupled to one of compensated currents Ia1 and Ia2. The Schottky diode in each leg of diode detector 311 is coupled to, and biased on by the corresponding one of compensated currents Ia1 and Ia2. Each leg of diode detector 311 has positive coefficient of change with temperature, which is substantially offset by the negative coefficient of change with temperature of compensated currents Ia1 and Ia2. In the preferred embodiment, each leg of diode detector 311 has a temperature coefficient of +3000 ppm/° C., and compensated currents Ia1 and Ia2 each have temperature coefficient of −3000 ppm/° C. The TC of +3000 ppm/° C. is due to the implant resistors (e.g. resistors 453, 454, 455 and 456) in each leg of diode detector 311.

The Schottky diode in one leg of diode detector 311 is coupled to and half-wave rectifies RF feedback signal 212 to produce temperature and voltage compensated power level signal 229, which has a DC level proportional to the output power level of RF output signal 214. By utilizing the present invention, power level signal 229 has a DC level which is stable to within 5 mV over temperature ranging from −55° C. to +125° C. and over power supply voltage ranging from 2.7 V to 4.75 V.

Figure 4:
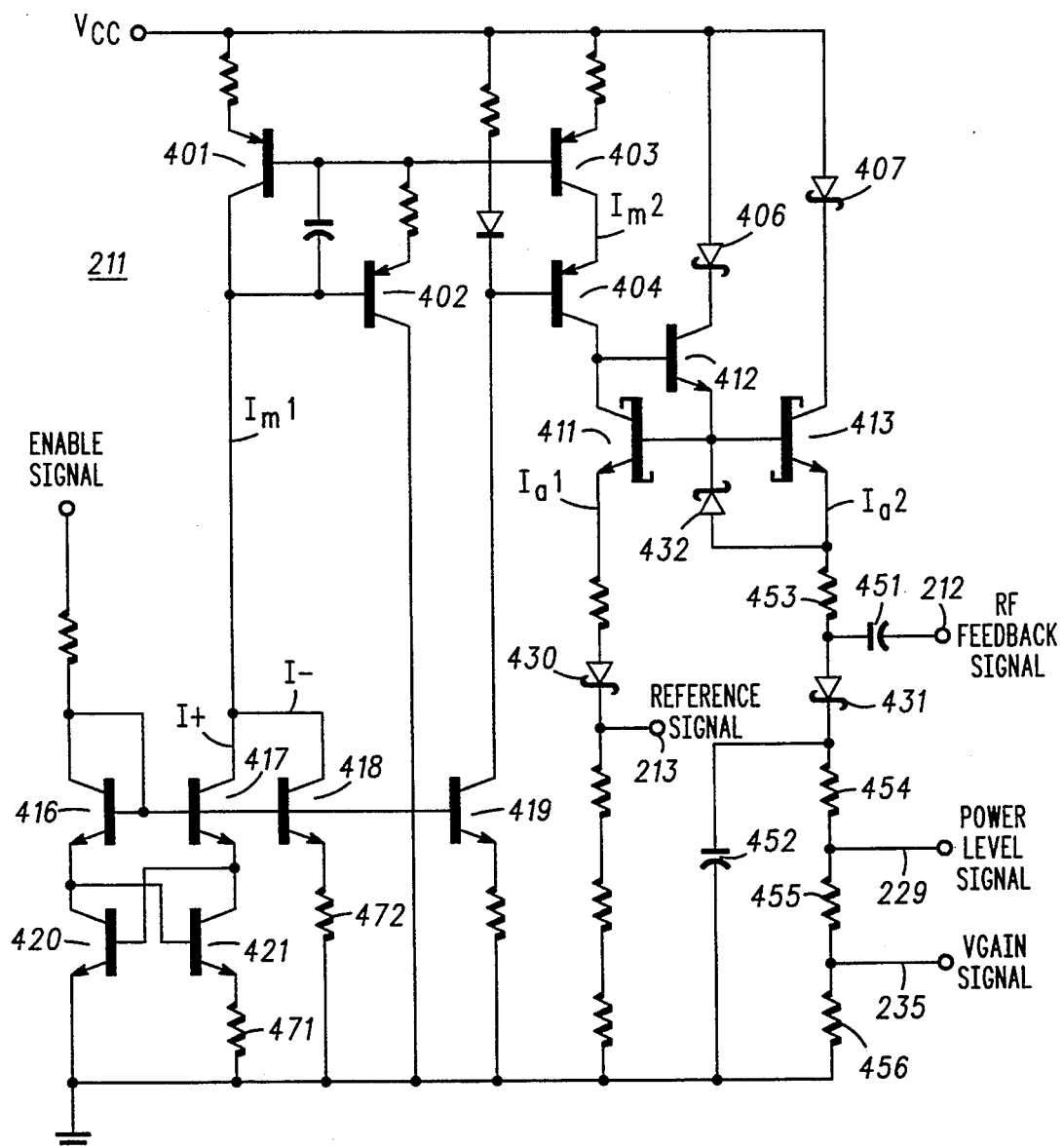
FIG. 4 is a schematic diagram of the TC controlled RF signal detecting circuitry in FIG. 3.

Referring to FIG. 4, there is illustrated a schematic diagram of the TC controlled RF signal detecting circuitry in FIG. 3. Power supply voltage Vcc can range between 2.7 V to 4.75 V. The ENABLE SIGNAL may be used to turn on or off detecting circuitry 211 by coupling it to a high or low voltage, respectively. Positive coefficient current source 303 has been implemented by NPN transistors 416, 417, 420 and 421. Negative coefficient current source 305 has been implemented by NPN transistor 418. Current mirror 301 has been implemented by PNP transistors 401 and 403. Currents I+ and I− and their respective temperature coefficients are scaled to the proper proportion by selection of the values of the emitter resistors 472 and 471 of transistors 418 and 421, respectively.

Anti-clamping current mirror 309 has been implemented by NPN transistors 411 and 413 and Schottky diodes 406 and 407. PNP transistor 404 applies current Im2 to transistor 411 and 443. NPN transistor 419 supplies base current to transistor 404. Transistor 411 applies current Ia1 to Schottky diode 430, and transistor 413 applies current Ia2 to Schottky diode 431. PNP transistor 402 balances the effect of the base current of transistors 401 and 403 in current mirror 301. NPN transistor 412 balances the effect of the base current of transistors 411 and 413 in anti-clamping current mirror 309. Schottky diode 432 protects the base to emitter junction of transistor 413 against large positive swings of RF FEEDBACK SIGNAL 212. During the large positive swings of RF FEEDBACK SIGNAL 212, Schottky diode 407 prevents conduction from Schottky diode 432 through the base to collector junction of transistor 413, and Schottky diode 406 prevents conduction from Schottky diode 432 through the base to collector junctions of transistors 411 and 412.

Diode detector 311 includes in one leg a resistor, Schottky diode 431, a capacitor to signal ground, and three resistors coupled in series to signal ground, and in the other leg a resistor, Schottky diode 430, and three resistors coupled in series to signal ground. In the preferred embodiment, Schottky diodes 431 and 432 and the resistors in each leg have identical electrical characteristics since they are on the same semiconductive substrate. The resistors in each leg also have substantially identical values. Schottky diode 431 is coupled by capacitor 451 to and half-wave rectifies RF FEEDBACK SIGNAL 212 to produce temperature and voltage compensated POWER LEVEL SIGNAL 229. That is, on positive excursions of the RF FEEDBACK SIGNAL 212, Schottky diode 431 conducts and charges capacitor 452 to produce POWER LEVEL SIGNAL 229. On negative excursions of the RF FEEDBACK SIGNAL 212, Schottky diode 431 shuts off and does not conduct. The POWER LEVEL SIGNAL 229 is taken at the junction of resistors 454 and 455, VGAIN SIGNAL 235 is taken at the junction of resistors 455 and 456, and the REFERENCE SIGNAL 213 is taken at the cathode of Schottky diode 430. REFERENCE SIGNAL 213 provides a compensated voltage to comparator 215 which corresponds to the value of the POWER LEVEL SIGNAL 229 for zero RF FEEDBACK SIGNAL 212.

According to a feature of the present invention, transistor 413 of current mirror 309 prevents Schottky diode 431 from clamping the voltage at the junction of its cathode with capacitor 451 and resistor 453. When RF FEEDBACK SIGNAL 212 is small or not present, current Ia2 provided by transistor 413 to Schottky diode 431 is 50 μA. However, when RF FEEDBACK SIGNAL 212 is large, current Ia2 provided by transistor 413 to Schottky diode 431 increases (e.g. to several milliamps) so that the voltage at the junction of capacitor 451 and resistor 453 substantially follows the voltage of RF FEEDBACK SIGNAL 212, thereby avoiding the clamping action of Schottky diode 431.

In the preferred embodiment, TC controlled RF signal detecting circuitry 211 in FIG. 4 is integrated on a semiconductive substrate using the MOSAIC 1.5 process. The TC of the output voltages for POWER LEVEL SIGNAL 229, REFERENCE SIGNAL 213, and VGAIN SIGNAL 235 are made substantially zero by the bias currents Ia1 and Ia2 whose TC is substantially equal but opposite to the TC of the resistors coupled to Schottky diodes 431 and 432. Since the output voltages have substantially zero TC and Schottky diodes 431 and 432 are matched in characteristics, POWER LEVEL SIGNAL 229 and REFERENCE SIGNAL 213 are both temperature and voltage level compensated over a wide temperature and voltage range.

For the MOSAIC 1.5 process, the TC of the implant resistors in TC controlled RF signal detecting circuitry 211 in FIG. 4 is approximately +3000 ppm/° C. Current Im2 is set to a TC of −3000 ppm/° C. to allow the output voltages for POWER LEVEL SIGNAL 229, REFERENCE SIGNAL 213, and VGAIN SIGNAL 235 to remain constant over temperature. Currents Im1 and Im2 are produced by the current generator made up of transistors 416, 417, 418, 420 and 421 and resistors 471 and 472. The equation of the voltage $V_{471}$ across resistor 471 is:

$$V_{471} = Vt*\ln[A421*A416)/(A420*A417)],$$

where A stands for the area of the transistor emitters. Voltage $V_{471}$ is the "Δo" portion of the TC equation; the TC of a "Δo" is +3333 ppm/° C. (due to Vt=kT/q). Voltage $V_{471}$ across resistor 471 sets the amount of current through the resistor 471, and sets the current in transistors 421 and 417 The TC of this current can be found by:

$$TC(I_{\Delta o/R}) = TC_{\Delta o} - TC_R.$$

Therefore, the TC of the Δo/R is slightly positive, since $TC_R$ is −3000 ppm and $TC_{\Delta o}$ is +3333 ppm/° C.

The o/R current generator is made up of transistor 418 and resistor 472. The base of transistor 418 is at $2V_{be}$, so the voltage drop across resistor 472 is one $V_{be}$. The TC of the current through transistor 418 is then the combination of the TC of one $V_{be}$ and the TC of resistor 472. Again, the TC of a 2 k implant resistor is +3000 ppm/° C. The o/R current generator TC is then:

$$TC(I_{o/R}) = TC(o) - TC(R) = [(Ego - Vbe)/(T*-Vbe) - 3000] = 6000 \text{ ppm.}$$

where $$(Ego - Vbe)/(T*Vbe) = -3000 \text{ ppm.}$$

The total TC of the current into the reference diode transistor 401 and thus in current source transistor 403 is then:

$$TC(I_{o/R})*I_{o/R} + TC(I_{\Delta o/R})*I_{\Delta o/R} = I_{TOTAL}*TC(I_{TOTAL}),$$

where $I_{TOTAL}$ is the sum of the two current generators. If the total current into the reference diode is 50 μA, and a TC of −3000 ppm/° C. is needed to cancel the +3000 ppm/° C. TC of the implant resistors in diode detector 311, then:

$$(-6000 \text{ ppm} *I_{526}/R) + (333 \text{ ppm} * I_{\Delta o/R}) = 50 \mu A*(-3000 \text{ ppm}),$$

which gives approximately, $$I_{o/R} = 26 \mu A, \text{ and}$$

$$I_{\Delta o/R} = 24 \mu A.$$

The value of resistor 471 in the Δo/R current generator and the value of resistor 472 in the o/R current generator are then chosen to give the current values found above.

The improved TC controlled RF signal detecting circuitry of the present invention is stable to within 5 mV over temperature ranging from −55° C. to +125° C. and power supply voltage ranging from 2.7 V to 4.75 V and can be advantageously utilized in any radio equipment where it is necessary to accurately sample the magnitude of an RF signal.

We claim:

1. A signal detector having an input coupled to receive a radio frequency (RF) signal from a signal source, the signal detector comprising:
   a first current source for generating a first current having a positive temperature coefficient of change with temperature;
   a second current source for generating a second current having a negative temperature coefficient of change with temperature;
   a first current mirror device coupled to the first and second current sources for combining the first and second currents and producing a first mirror current;
   a second current mirror device coupled to the first current mirror device and responsive to the first mirror current for producing a second mirror current; and
   a rectifying circuit including a diode, the rectifying circuit coupled to the input and to the second current mirror circuit, the rectifying circuit biased by the second mirror current to produce an output signal having a magnitude proportional to the magnitude of the RF signal at the first input, and wherein the second mirror current increases the bias current supplied to the diode as required by the input signal to prevent clamping of the rectifying circuit.

2. The signal detector according to claim 1, wherein the rectifying circuit includes a Schottky diode coupled to a capacitor in parallel with at least one resistor.

3. The signal detector according to claim 1, wherein the first current mirror device includes a first transistor for combining the first and second currents and a second transistor for mirroring the combined first and second currents to produce the first mirror current.

4. The signal detector according to claim 1, wherein the second current mirror device includes a first transistor for mirroring the first mirror current to produce the second mirror current and a second transistor for mirroring the first mirror current to produce a third mirror current.

5. The signal detector according to claim 4, wherein the rectifying circuit includes a first leg with a first Schottky diode coupled to a capacitor in parallel with at least one resistor, and a second leg with a second Schottky diode coupled to at least one resistor, the first Schottky diode being coupled to the RF signal and the second mirror current, and the second Schottky diode being coupled to the third mirror current.

6. The signal detector according to claim 4, wherein the first and second transistors are NPN transistors.

7. The signal detector according to claim 4, further including a diode coupled between the base and emitter of the first transistor.

8. The signal detector according to claim 4, further including a first diode coupled in series with the collector of the first transistor, and a second diode coupled in series with the collector of the second transistor.

9. The signal detector according to claim 1, in combination with a semiconductive substrate, said detecting circuitry being integrated on the semiconductive substrate.

10. A radio frequency (RF) signal transmitter, comprising:
an antenna for radiating radio frequency (RF) signals;
an amplifier responsive to a control signal for amplifying an RF signal from a signal source to produce an amplified RF signal;
a coupler coupled to the amplifier and to the antenna for coupling the amplified RF signal to the antenna and for producing a feedback RF signal having a magnitude proportional to the magnitude of the amplified RF signal;
detecting circuitry coupled to the coupler to receive the feedback RF signal, the detecting circuitry comprising:
a bias current generator to output a temperature dependent bias current having a predetermined temperature characteristic; and
a rectifying circuit including a diode, the rectifying circuit coupled to the bias current generator and to the coupler, the rectifier circuit receiving an input signal from the coupler and having a temperature characteristic which is inversely related to the predetermined temperature characteristic of the bias current generator, the rectifying circuit biased by the bias current to produce an output signal having a magnitude proportional to the magnitude of the amplified RF signal and substantially independent of temperature variations, and wherein the bias current generator increases the bias current supplied to the diode as required to prevent clamping of the rectifying circuit; and
a processing circuit coupled to the detecting circuitry and generating the control signal, the processing circuit adjusting the magnitude of the control signal in response to the magnitude of the output signal of the rectifying circuit.

11. The transmitter as defined in claim 10, wherein the current generating circuit includes a first current source to generate a first current, having a positive temperature coefficient of change with temperature, and a second current source to generate a second current, having a negative temperature coefficient of change with temperature.

12. The transmitter as defined in claim 11, wherein the current generating circuit further includes a first current mirror device coupled to said first and second current sources for combining the first and second currents and producing a first mirror current in responsive thereto and a second current mirror device coupled to the first mirror current device to receive said first mirror current and responsive thereto for producing a second mirror current, the second mirror current comprising the bias current.

13. The RF signal transmitter according to claim 12, wherein the first current mirror device includes a first transistor for combining the first and second currents and a second transistor for mirroring the combined first and second currents to produce the first mirror current.

14. The RF signal transmitter according to claim 12, wherein the second current mirror device includes a first transistor for mirroring the first mirror current to produce the second mirror current and a second transistor for mirroring the first mirror current to produce a third mirror current.

15. The RF signal transmitter according to claim 14, wherein the rectifying circuit includes a first leg with a first Schottky diode coupled to a capacitor in parallel with at least one resistor, and a second leg with a second Schottky diode coupled to at least one resistor, said first Schottky diode being coupled to the feedback RF signal and the second mirror current, and said second Schottky diode being coupled to the third mirror current.

16. A radio transceiver, comprising:
an antenna for receiving and radiating radio frequency (RF) signals;
a receiver coupled to the antenna for receiving an RF signal;
an amplifier responsive to a control signal for amplifying an RF signal from a signal source to produce an amplified RF signal;
a coupler coupled to the amplifier and to the antenna for coupling the amplified RF signal to the antenna and for producing a feedback RF signal having a magnitude proportional to the magnitude of the amplified RF signal;
detecting circuitry coupled to the coupler to receive the feedback RF signal, comprising:
a first current source for generating a first current having a positive temperature coefficient of change with temperature;
a second current source for generating a second current having a negative temperature coefficient of change with temperature;
a first current mirror device coupled to the first current source and the second current source for combining the first and second currents and producing a first mirror current;
a second current mirror device coupled to the first current mirror device to receive the first mirror current and for producing a second mirror current responsive thereto;
a rectifying circuit including a diode, the rectifying circuit coupled to said coupler and to the second current mirror device, the rectifying circuit biased by the second mirror current for rectifying the feedback RF signal to produce an output power level signal having a magnitude proportional to the magnitude of the amplified RF signal, and wherein the second mirror current increases the bias current supplied to the diode as required to prevent clamping of the rectifying circuit; and
a processing circuit coupled to the detecting circuitry and generating the control signal, the processing circuit adjusting the magnitude of the control signal in response to the magnitude of the output power level signal.

17. The radio transceiver according to claim 16, wherein the first current mirror device includes a first transistor for combining the first and second currents and a second transistor for mirroring the combined first and second currents to produce the first mirror current.

18. The radio transceiver according to claim 16, wherein the second current mirror device includes a first transistor for mirroring the first mirror current to produce the second mirror current and a second transistor for mirroring the first mirror current to produce a third mirror current.

19. The radio transceiver according to claim 18, wherein the rectifying circuit includes a first leg with a first Schottky diode coupled to a capacitor in parallel with at least one resistor, and a second leg with a second Schottky diode coupled to at least one resistor, said first Schottky diode being coupled to the feedback RF signal and the second mirror current, and said second Schottky diode being coupled to the third mirror current.

20. Detecting circuitry having an input capacitively coupled to receive a radio frequency (RF) signal from a signal source, said detecting circuitry comprising:
   a current source for generating a first temperature dependent current;
   a current mirror device coupled to the current source and responsive to the first current for producing a first mirror current; and
   a rectifying circuit including a diode and a capacitor, the rectifying circuit coupled to the input and coupled to the current mirror device and being biased by the first mirror current for rectifying the RF signal to produce an output signal having a magnitude proportional to the magnitude of the RF signal, and wherein the first mirror current increases the bias current supplied to the diode and capacitor as required by the input signal to prevent clamping of the rectifying circuit.

21. The detecting circuitry according to claim 20, wherein the rectifying circuit includes a Schottky diode coupled to a capacitor in parallel with at least one resistor.

22. The detecting circuitry according to claim 20, wherein the current mirror device includes a first transistor for mirroring the first current to produce the first mirror current and a second transistor for mirroring the first current to produce a second mirror current.

23. The detecting circuitry according to claim 22, wherein the rectifying circuit includes a first leg with a first Schottky diode coupled to a capacitor in parallel with at least one resistor, and a second leg with a second Schottky diode coupled to at least one resistor, said first Schottky diode being coupled to the RF signal and the first mirror current, and said second Schottky diode being coupled to the second mirror current.

24. The detecting circuitry according to claim 22, wherein the first and second transistors are NPN transistors.

25. The detecting circuitry according to claim 22, further including a diode coupled between the base and emitter of the first transistor.

26. The detecting circuitry according to claim 22, further including a first diode coupled in series with the collector of the first transistor, and a second diode coupled in series with the collector of the second transistor.

27. The detecting circuitry according to claim 20, in combination with a semiconductive substrate, said detecting circuitry being integrated on the semiconductive substrate.

28. A radio frequency (RF) signal transmitter, comprising:
   an antenna for radiating radio frequency (RF) signals;
   an amplifier responsive to a control signal for amplifying an RF signal from a signal source to produce an amplified RF signal;
   a coupler coupled to the amplifier and to the antenna for coupling the amplified RF signal to the antenna and for producing a feedback RF signal having a magnitude proportional to the magnitude of the amplified RF signal;
   detecting circuitry capacitively coupled to the coupler to receive the feedback RF signal, comprising:
   a current source for generating a first current;
   a current mirror device coupled to the current source to receive the first current for producing a first mirror current responsive thereto; and
   a rectifying circuit including a diode, the rectifying circuit having an input coupled to the coupler and being coupled to the current mirror device and being biased by the first mirror current for rectifying the feedback RF signal to produce an output power level signal having a magnitude proportional to the magnitude of the amplified RF signal, and wherein the first mirror current increases the bias current supplied to the diode as required by the RF signal to prevent clamping of the rectifying circuit; and
   a processing circuit coupled to the detecting circuitry and generating the control signal, the processing circuit for adjusting the magnitude of the control signal in response to the magnitude of the output power level signal.

29. The RF signal transmitter according to claim 28, wherein the current mirror device includes a first transistor for mirroring the first current to produce the first mirror current and a second transistor for mirroring the first current to produce a second mirror current.

30. The RF signal transmitter according to claim 29, wherein the rectifying circuit includes a first leg with a first Schottky diode coupled to a capacitor in parallel with at least one resistor, and a second leg with a second Schottky diode coupled to at least one resistor, said first Schottky diode being coupled to the feedback RF signal and the first mirror current, and said second Schottky diode being coupled to the second mirror current.

31. A radio transceiver, comprising:
   an antenna for receiving and radiating radio frequency (RF) signals;
   a receiver coupled to the antenna for receiving an RF signal;
   an amplifier responsive to a control signal for amplifying an RF signal from a signal source to produce an amplified RF signal;
   a coupler coupled to the amplifier and to the antenna for coupling the amplified RF signal to the antenna and for producing a feedback RF signal having a magnitude proportional to the magnitude of the amplified RF signal;
   detecting circuitry capacitively coupled to the coupler to receive the feedback RF signal, the detecting circuitry comprising:
   a current source for generating a first current;
   a current mirror device coupled to the current source and responsive to the first current for producing a first mirror current; and
   a rectifying circuit including a diode, the rectifying circuit having an input coupled to the coupler and being coupled to the current mirror device and being biased by the first mirror current to rectify the feedback RF signal to produce an output power level signal having a magnitude proportional to the magnitude of the amplified RF signal, and wherein the first mirror current increases the current supplied to the diode as required to prevent clamping of the rectifying circuit; and
   a processing circuit coupled to the detecting circuitry and generating the control signal, the processing circuit adjusting the magnitude of the control signal in response to the magnitude of the output power level signal.

32. The radio transceiver according to claim 31, wherein the current mirror device includes a first transistor for mirroring the first current to produce the first mirror current and a second transistor for mirroring the first current to produce a second mirror current.

33. The radio transceiver according to claim 32, wherein the rectifying circuit includes a first leg with a first Schottky diode coupled to a capacitor in parallel with at least one resistor, and a second leg with a second Schottky diode coupled to at least one resistor, said first Schottky diode being coupled to the feedback RF signal and the first mirror current, and said second Schottky diode being coupled to the second mirror current.

34. A signal detector having an input coupled to receive a radio frequency (RF) signal from a signal source, the signal detector comprising:
- a first current source for generating a first current having a positive temperature coefficient of change with temperature;
- a second current source for generating a second current having a negative temperature coefficient of change with temperature;
- a first current mirror device coupled to the first and second current sources for combining the first and second currents and producing a first mirror current;
- a second current mirror device coupled to the first current mirror device and responsive to the first mirror current for producing a second mirror current; and
- a rectifying circuit including a diode and a capacitor, the rectifying circuit coupled to the input and to the second current mirror circuit, the rectifying circuit biased by the second mirror current for rectifying an RF signal to produce an output signal having a magnitude proportional to the magnitude of the RF signal, and wherein the second mirror current increases the bias current supplied to the diode and capacitor as required by the input signal to prevent clamping of the rectifying circuit.

35. Detecting circuitry having an input capacitively coupled to receive a radio frequency (RF) signal from a signal source, said detecting circuitry comprising:
- a current source for generating a first current;
- a current mirror device coupled to the current source and responsive to the first current for producing a mirror current; and
- a rectifying circuit including a diode and a capacitor, the rectifying circuit coupled to the input and to the current mirror device, the rectifying circuit biased by the mirror current for rectifying an RF signal to produce an output signal having a magnitude proportional to the magnitude of the RF signal, and wherein the mirror current increases the current supplied to the diode and capacitor as required by the input signal to prevent clamping of the rectifying circuit.

* * * * *